(12) United States Patent
Ko

(10) Patent No.: US 7,843,757 B2
(45) Date of Patent: Nov. 30, 2010

(54) SEMICONDUCTOR MEMORY DEVICE INCLUDING ADDRESS INPUT PATH SELECTION CIRCUIT

(75) Inventor: Han-Suk Ko, Kyoungki-Do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 192 days.

(21) Appl. No.: 12/165,076

(22) Filed: Jun. 30, 2008

(65) Prior Publication Data

US 2009/0059710 A1 Mar. 5, 2009

(30) Foreign Application Priority Data

Aug. 29, 2007 (KR) .................. 10-2007-0087068

(51) Int. Cl.
*G11C 8/00* (2006.01)
(52) U.S. Cl. .................. 365/230.03; 365/230.06; 365/233.1; 365/239; 365/194
(58) Field of Classification Search ............ 365/230.03, 365/230.06, 233.1, 239, 194
See application file for complete search history.

(56) References Cited

U.S. PATENT DOCUMENTS

| 7,027,347 | B2 * | 4/2006 | Shigenami et al. | ...... 365/230.03 |
| 7,508,731 | B2 * | 3/2009 | Park | ...... 365/233.18 |
| 7,542,353 | B2 * | 6/2009 | Park | ...... 365/185.29 |
| 7,660,173 | B2 * | 2/2010 | Song | ...... 365/201 |

FOREIGN PATENT DOCUMENTS

| KR | 2005-0076257 | 7/2005 |
| KR | 2006-0027665 | 3/2006 |

* cited by examiner

*Primary Examiner*—Connie C Yoha
(74) *Attorney, Agent, or Firm*—IP & T Group LLP

(57) ABSTRACT

A semiconductor memory device having banks includes an address input path selection circuit in each of the banks, the address input path selection circuit including a signal input unit configured to selectively activate a Y-address input enable signal in response to a bank-specific read/write signal, and a latch unit configured to latch the Y-address input enable signal. The address input path selection circuit reduces circuit area by reducing delay elements and prevents malfunction by operating only in a bank active state.

16 Claims, 4 Drawing Sheets

SEMICONDUCTOR MEMORY DEVICE INCLUDING ADDRESS INPUT PATH SELECTION CIRCUIT

CROSS-REFERENCE TO RELATED APPLICATION

The present invention claims priority of Korean patent application number 10-2007-0087068, filed on Aug. 29, 2007, which is incorporated by reference in its entirety.

BACKGROUND OF THE INVENTION

The present invention relates to a semiconductor memory device, and more particularly to an address input path selection circuit which determines which one of a number of banks an address will be input to in the semiconductor memory device.

FIG. 1 is a block diagram of a conventional semiconductor memory device.

Referring to FIG. 1, the conventional semiconductor memory device includes an address buffer 101, a Y-address controller 102, banks (0~3) 103, a command decoder 104, a read/write signal generator 105, address input path selection circuits 106, and a Yi signal generator 107.

The address buffer 101 receives and buffers bank addresses BAN<0:1> and addresses AN<0:11> to output buffered addresses EAT_AX<0:11>. Furthermore, the address buffer 101 decodes the bank addresses BAN<0:1> to output bank information BANK<0:3>. The Y-address controller 102 outputs a Y-address signal Y-ADDRESS, which is input to the banks 103 to control the timing of addressing, in response to the buffered addresses EAT_AX<0:11>, an internal write signal CASP6WT and an internal read signal CASP6RD.

The command decoder 104 receives and decodes external command signals, for example, a chip select signal /CS, a row address strobe signal /RAS, a column address strobe signal /CAS and a write enable signal /WE, thereby outputting the internal write signal CASP6WT and the internal read signal CASP6RD. The read/write signal generator 105 receives the internal read signal CASP6RD, the internal write signal CASP6WT and the bank information BANK<0:3>, and generates bank-specific read/write signals CASP8X<0:3>, which are respectively activated in the read or write operations of the corresponding bank.

For example, the bank-specific read/write signal CASP8X<0> for the bank 0 is activated when the internal read signal CASP6RD or the internal write signal CASP6WT is activated in a state where the bank 0 is selected, i.e., the BANK<0> is activated.

The Yi signal generator 107 generates signals YAE<0:3> which are the source signal of a Yi signal for turning on/off a Yi transistor of a semiconductor memory device. That is, the signals YAE<0:3> are a pulse signal for controlling the Yi transistor.

As many address input path selection circuits 106 as the banks 103 are provided to output Y-address input enable signals CAST10<0:3> of the respective banks. When the Y-address input enable signals CAST10<0:3> are activated, the Y-address signal Y-ADDRESS and the signals YAE<0:3> are input to the corresponding banks.

For example, when the Y-address input enable signal CAST10<0> for the bank 0 is activated, the Y-address signal Y-ADDRESS and the signal YAE<0> are input to the bank 0.

Meanwhile, the banks 103 are illustrated as a single configuration block in FIG. 1, but the banks 103 indicate four banks, i.e., the banks 0, 1, 2 and 3.

FIG. 2 is a circuit diagram illustrating one of the address input path selection circuits 106 of FIG. 1.

Specifically, FIG. 2 illustrates the address input path selection circuit configured to output the Y-address input enable signal CAST10<0> for the bank 0.

Upon operation of the address input path selection circuit, when the internal read signal CASP6RD is activated by the combination of commands input to the command decoder 104, the bank-specific read/write signal CASP8X<0> for the bank 0 is activated. Then, the Y-address input enable signal CAST10<0> is activated so that the Y-address signal Y-ADDRESS and the signal YAE<0> are input to the bank 0.

Furthermore, when the bank-specific read/write signal CASP8X<0> for the bank 0 is activated continuously, the Y-address input enable signal CAST10<0> is kept at a high level. However, when the internal read signal CASP6RD or the internal write signal CASP6WT is activated in a state where the bank-specific read/write signal CASP8X<0> for the bank 0 is deactivated (that is, during the read or write operations of other banks), the Y-address input enable signal CAST10<0> is deactivated to a low level. At this point, one of the Y-address input enable signals CAST10<1:3> for other banks is activated.

FIG. 3 is a timing diagram illustrating the operation of the address input path selection circuit of FIG. 2. It can be seen from FIG. 3 that the Y-address input enable signal CAST10<0> is activated or deactivated in an above-described manner.

The conventional address input path selection circuits 106 generate the Y-address input enable signals CAST10<0:3> by combining the bank-specific read/write signals CASP8X<0:3>, the internal read signal CASP6RD and the internal write signal CASP6WT. However, since the bank-specific read/write signals CASP8X<0:3>, the internal read signal CASP6RD, and the internal write signal CASP6WT have passed a different number of gates, the conventional address input path selection circuits 106 require a lot of delay elements 201, 202 and 203 for adjusting the timing of these signals. Since as many address input path selection circuits 106 as the banks 103 are needed, the address input path selection circuits 106 will occupy a large area in the semiconductor memory device.

Since the Y-address input enable signals CAST10<0:3> which allow the Y-address signal Y-ADDRESS to be input to a selected bank are signals associated with a column operation, they are needed only in the bank active state. However, in a case where the Y-address input enable signals CAST10<0:3> are generated by the circuit shown in FIG. 2, at least one of the Y-address input enable signals CAST10<0:3> is necessarily activated when the semiconductor memory device operates. Accordingly, malfunction may occur when the read/write operating command is input irrespective of the column operation.

SUMMARY OF THE INVENTION

Embodiments of the present invention are directed to providing a semiconductor memory device including an address input path selection circuit, which can reduce circuit area by reducing delay elements, and can prevent malfunction by operating the address input path selection circuit only in a bank active state.

In accordance with an aspect of the invention, there is provided a semiconductor memory device having plural banks, which includes an address input path selection circuit in each of the plural banks, the address input path selection circuit including a signal input unit configured to selectively activate a Y-address input enable signal in response to s bank-specific read/write signals, and a latch unit configured to latch the Y-address input enable signal.

In accordance with an aspect of the invention, there is provided a semiconductor memory device, which includes address input path selection circuits configured to output Y-address input enable signals in response to bank-specific read/write signals, and a bank active signal generator configured to enable the address input path selection circuits in response to an internal active signal and a bank address.

That is, the invention uses the bank-specific read/write signal for the address input path selection circuit to generate the Y-address input enable signal. In addition, the bank active signal is used as an enable signal of the address input path selection circuit. Furthermore, in contrast to the address input path selection circuit of the conventional semiconductor memory device, the address input path selection circuit of the memory device of the invention does not employ the internal read signal and the internal write signal.

DESCRIPTION OF SPECIFIC EMBODIMENTS

Hereinafter, a semiconductor memory device in accordance with the present invention will be described in detail with reference to the accompanying drawings.

Figure 4:
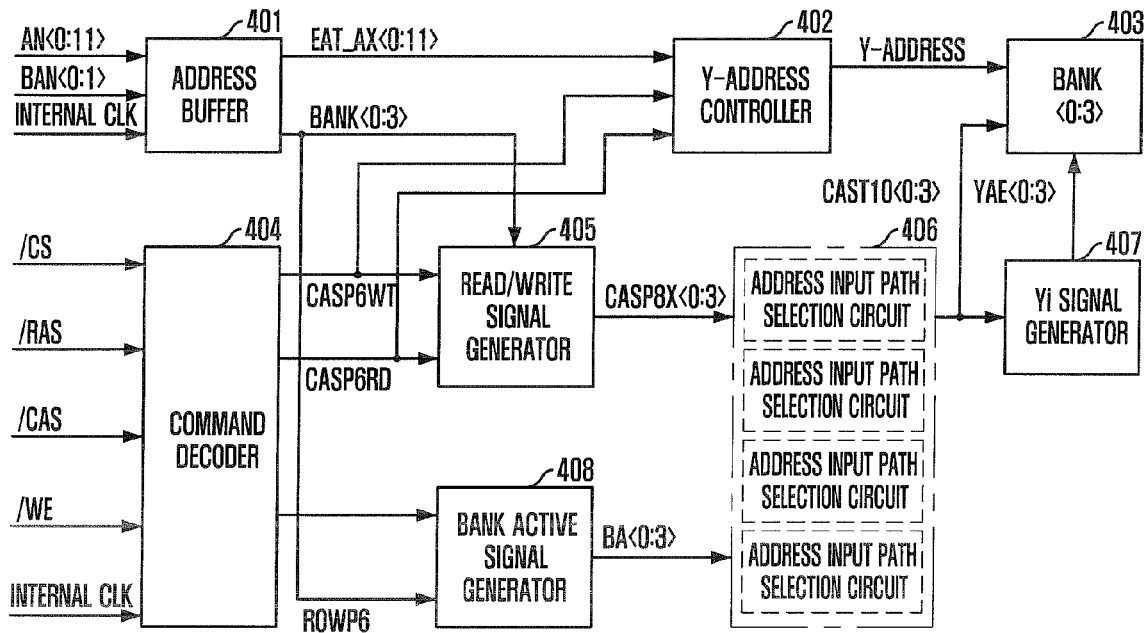
FIG. 4 is a block diagram illustrating a semiconductor memory device in accordance with an embodiment of the present invention.

FIG. 4 is a block diagram illustrating a semiconductor memory device in accordance with an embodiment of the invention.

Referring to FIG. 4, the semiconductor memory device in accordance with the embodiment of the invention includes an address buffer 401, a Y-address controller 402, a plurality of banks (0~3) 403, a command decoder 404, a read/write signal generator 405, a plurality of address input path selection circuits 406, a Yi signal generator 407, and a bank active signal generator 408.

Since the address buffer 401, the Y-address controller 402, the banks 403, the command decoder 404, the read/write signal generator 405, and the Yi signal generator 407 are the same as the conventional semiconductor memory device described above, their description will be omitted.

The bank active signal generator 408 receives an internal active signal ROWP6 decoded by the command decoder 404, and bank information BANK<0:3> output from the address buffer 401 to output bank active signals BA<0:3>. The internal active signal ROWP1 may includes one of signals internally activated in an active operation of the semiconductor memory device. As is well known, the bank active signals BA<0:3> are a signal for activating the corresponding banks 403.

The address input path selection circuits 406 do not employ an internal write signal CASP6WT and the internal read signal CASP6RD, and outputs Y-address input enable signals CAST10<0:3> in response to bank-specific read/write signals CASP8X<0:3>, as opposed to the conventional address input path selection circuits 106. Furthermore, the address input path selection circuits 406 receive the bank active signals BA<0:3> as their enable signals and operate in response to the bank active signals BA<0:3>. The structure and operation of the address input path selection circuits 406 will be described below in detail with reference to FIG. 5.

Figure 5:
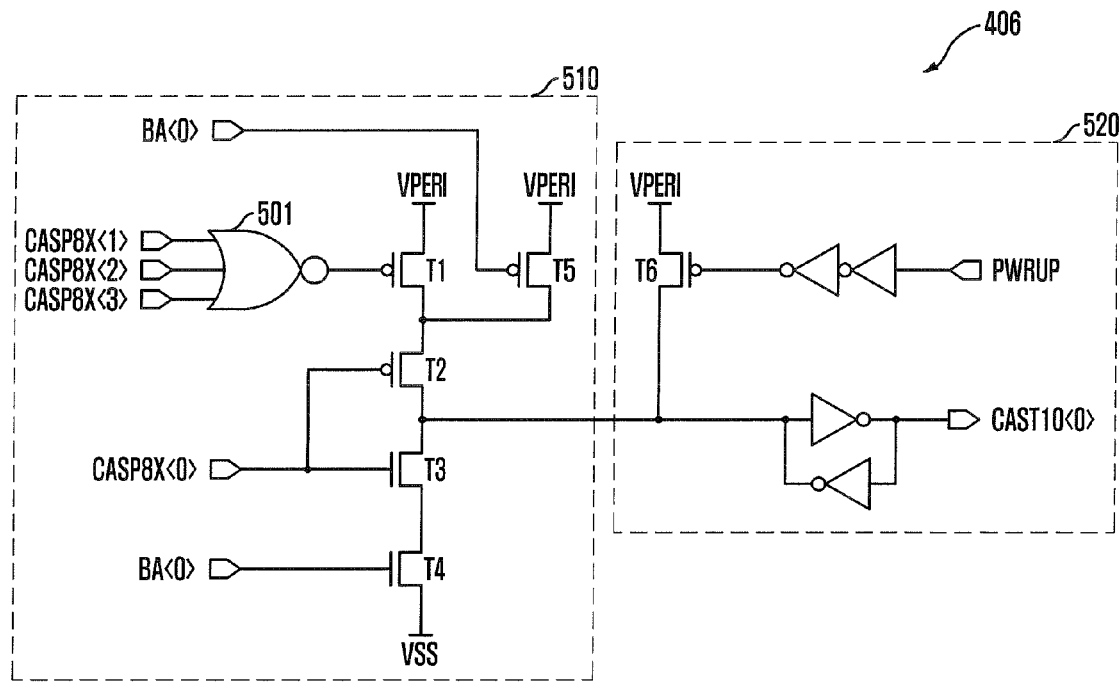
FIG. 5 illustrates one of address input path selection circuits 406 of FIG. 4.

FIG. 5 is a circuit diagram illustrating one of the address input path selection circuits 406 of FIG. 4.

Specifically, FIG. 5 illustrates the address input selection circuit configured to output the Y-address input enable signal CAST10<0> for the bank 0.

The address input path selection circuit, which is provided in each bank of the semiconductor memory device, includes a signal input unit 510 and a latch unit 520. The signal input unit 510 activates the Y-address input enable signal CAST10<0> for the bank 0 in response to the bank-specific read/write signal CASP8X<0> for the corresponding bank 0, and deactivates the Y-address input enable signal CAST10<0> for the bank 0 in response to the bank-specific read/write signal CASP8X<1:3> for other banks. The latch unit 520 latches and outputs the Y-address input enable signal CAST10<0> to the bank 0.

The signal input unit 510 includes transistors T4 and T5 receiving the bank active signal BA<0> to allow the address input path selection circuit to operate only in a bank active state. That is, the signal input unit 510 can allow the Y-address input enable signal CAST10<0> to be activated only in the bank active state.

The bank-specific read/write signals CASP8X<0:3> input to the signal input unit 510 is a pulse signal. Accordingly, the latch unit 520 maintains the Y-address input enable signal CAST10<0> until the follows-up bank-specific read/write signals CASP8X<0:3> are input to the signal input unit 510.

During the enablement of the address input path selection circuit by the activated bank active signal BA<0>, a transistor T3 is turned on when the Y-address input enable signal CAST10<0> for the bank 0 is activated, so that the Y-address input enable signal CAST10<0> is activated to a high level. Moreover, when any one of the bank-specific read/write signals CASP8X<1:3> for other banks is activated, a NOR gate 501 outputs a low level signal so that a transistor T1 is turned on, and thus the Y-address input enable signal CAST10<0> for the bank 0 is deactivated.

That is, when the bank active signal BA<0> is in an activated state, the Y-address input enable signal CAST10<0> is activated by the activated bank-specific read/write signal CASP8X<0> for the corresponding bank, and is deactivated by the activated bank-specific read/write signals CASP8X<1:3> for the other banks.

When the bank active signal BA<0> for the corresponding bank is deactivated, the transistor T5 is turned on and the transistor T4 is turned off. Therefore, the Y-address input enable signal CAST10<0> for the corresponding bank is deactivated irrespective of the logical level of the bank-specific read/write signal CASP8X<0>. That is, when the bank active signal BA<0> is deactivated, the Y-address input enable signal CAST10<0> is always deactivated.

Accordingly, the invention may prevent a malfunction that is caused by the activation of the Y-address input enable signal CAST10<0> in spite of the deactivated state of the bank.

Figure 1:
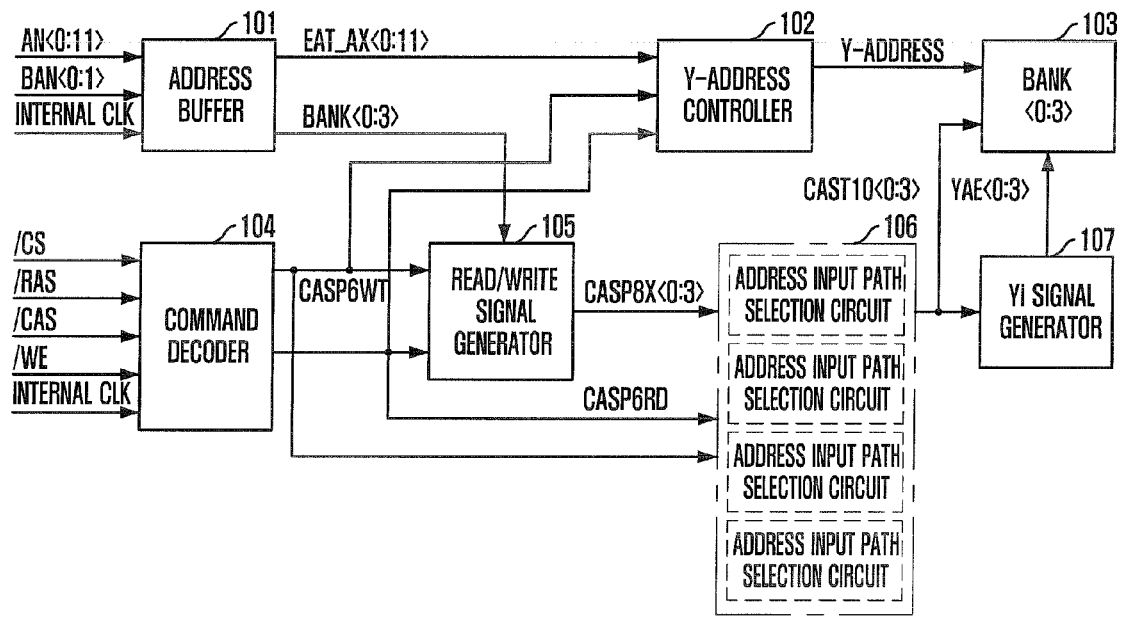
FIG. 1 is a block diagram of a conventional semiconductor memory device.
Figure 2:
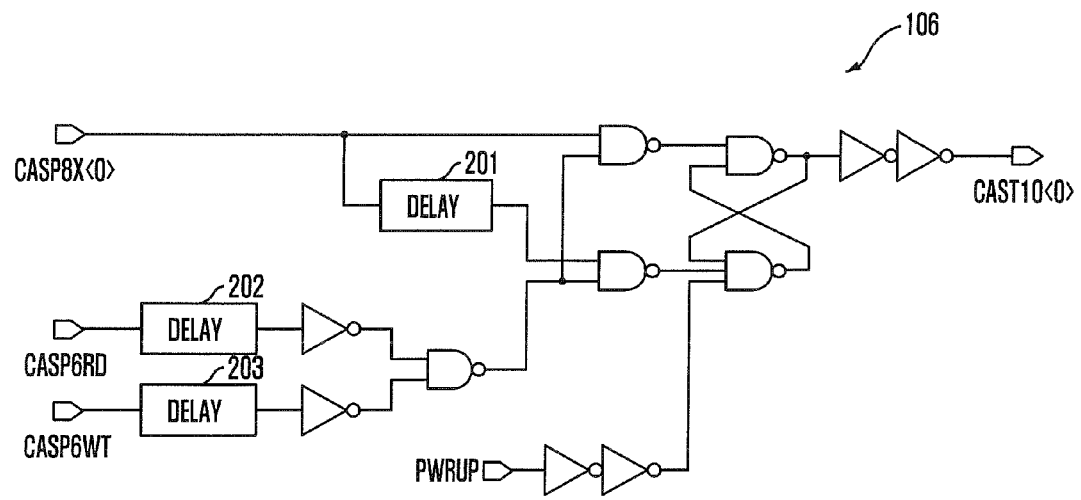
FIG. 2 is a circuit diagram illustrating one of address input path selection circuits of FIG. 1.
Figure 3:
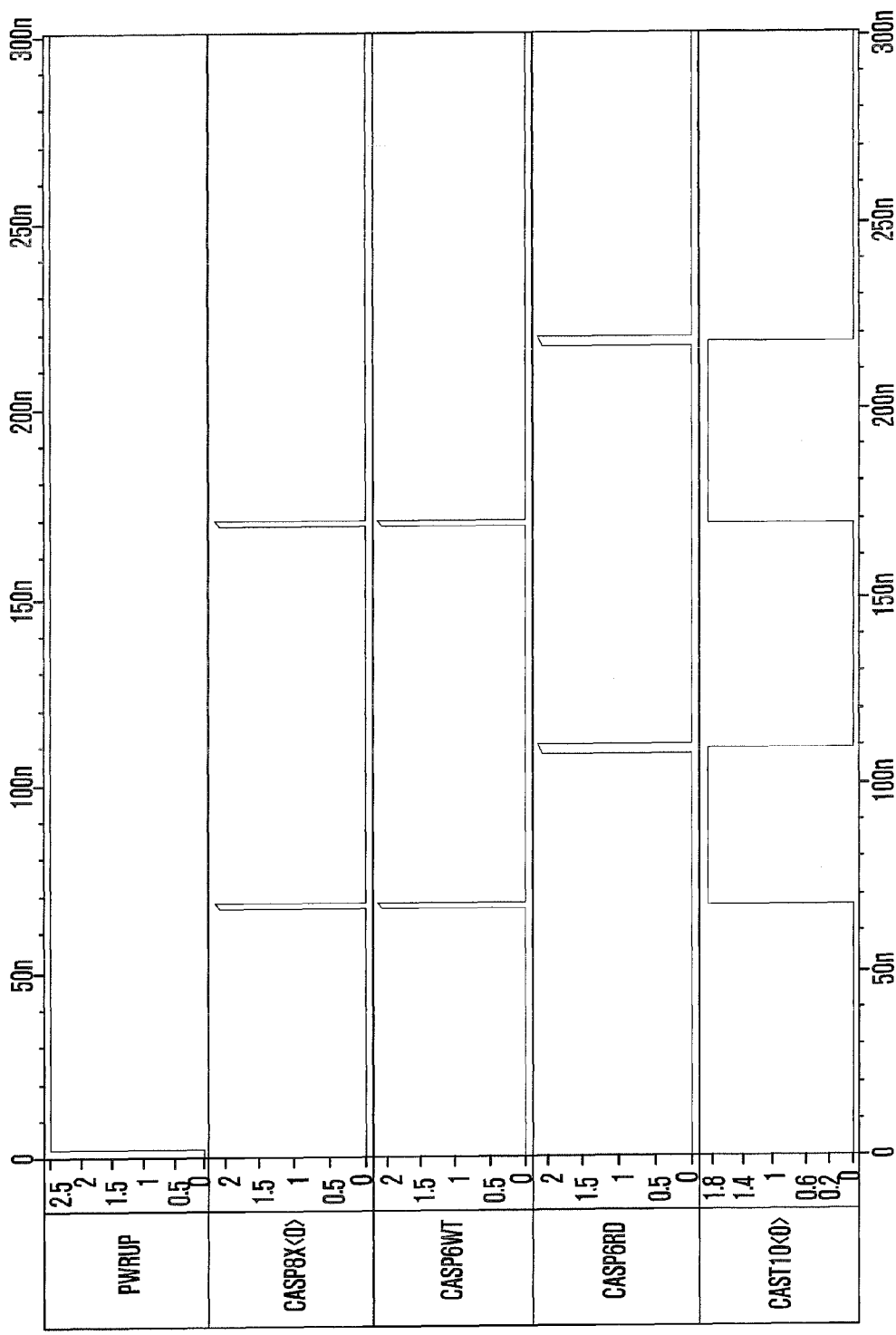
FIG. 3 is a timing diagram illustrating the operation of the address input path selection circuit of FIG. 2.

Moreover, since the Y-address input enable signal is activated or deactivated in response to the same kind of signals, the semiconductor memory device of the invention does not require a lot of delay elements (e.g., the delay elements 201, 202 and 203 in FIG. 2), as opposed to the conventional semiconductor memory device, thereby reducing the entire circuit area of the semiconductor memory device.

Meanwhile, a power-up signal PWRUP of FIG. 5 is used to set the initial value of the latch unit 520.

Figure 6:
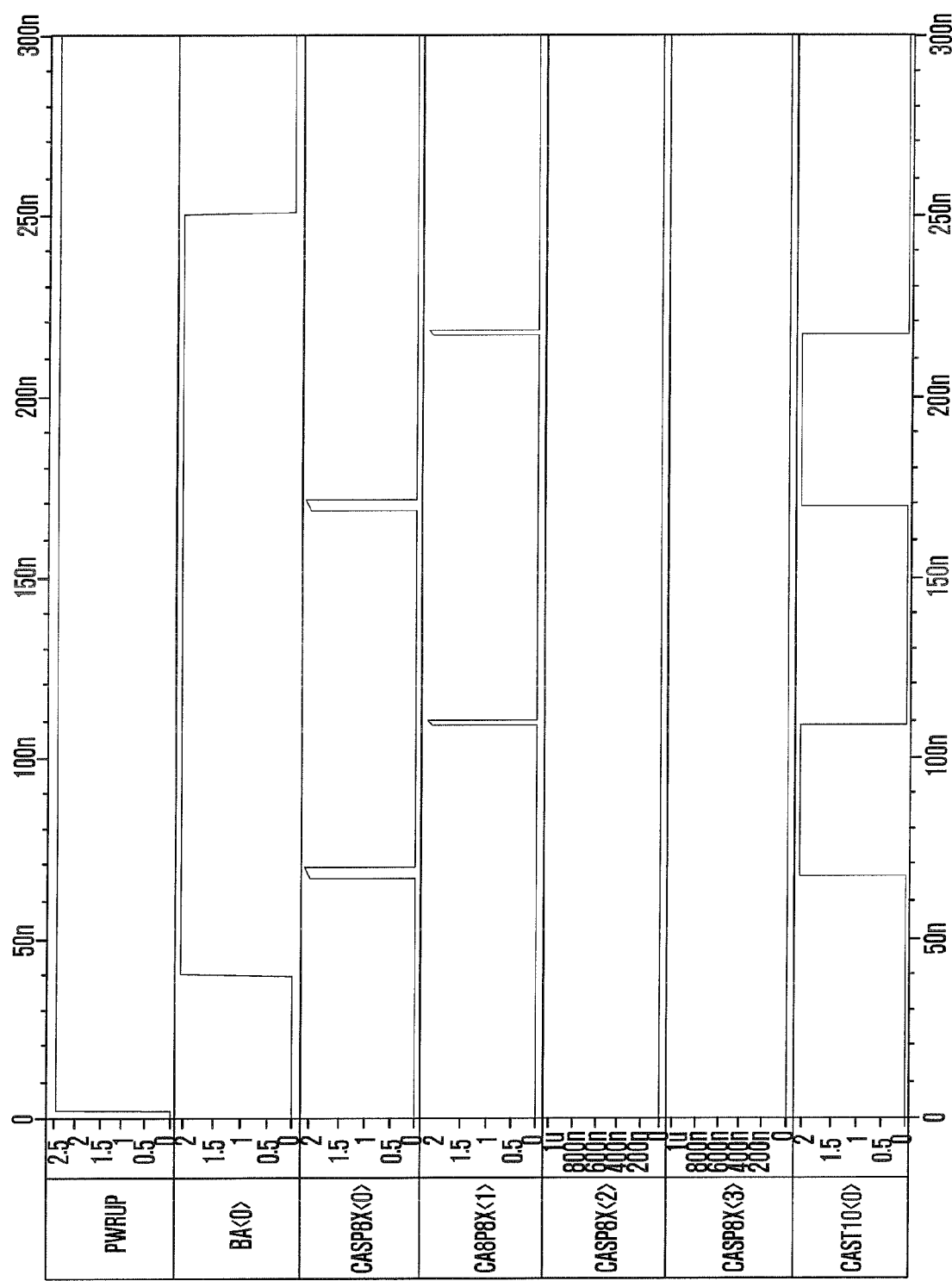
FIG. 6 is a timing diagram illustrating the operation of the address input path selection circuit of FIG. 5.

FIG. 6 is a timing diagram illustrating the operation of the address input path selection circuit of FIG. 5. It can be seen from FIG. 6 that the Y-address input enable signal CAST10<0> is activated or deactivated in an above-described manner.

In accordance with the embodiments of the invention, the address input path selection units generate the Y-address input enable signals by using the bank-specific read/write signals, instead of the internal read signal and the internal write signal. Accordingly, the address input path selection units need not use a lot of delay elements for adjusting the timing of different kind of signals, thereby reducing the entire circuit area of the semiconductor memory device.

Furthermore, the Y-address input enable signals are not unnecessarily activated because the address input path selection circuits operate only when the bank active signal is activated, thereby preventing the malfunction of the semiconductor memory device.

While the invention has been described with respect to the specific embodiments, it will be apparent to those skilled in the art that various changes and modifications may be made without departing from the spirit and scope of the invention as defined in the following claims.

What is claimed is:

1. A semiconductor memory device having plural banks, comprising:
   an address input path selection circuit in each of the plural banks, each of the address input path selection circuits including:
   a signal input unit configured to selectively activate a Y-address input enable signal in response to bank-specific read/write signals; and
   a latch unit configured to latch the Y-address input enable signal,
   wherein the signal input unit activates the Y-address input enable signal of a corresponding bank in response to a bank-specific read/write signal of the corresponding bank and deactivates the Y-address input enable signal in response to bank-specific read/write signals of others of the banks and the bank specific read/write signal of the corresponding bank is activated when the corresponding bank is selected and deactivated when the corresponding bank is not selected.

2. The semiconductor memory device as recited in claim 1, wherein the address input path selection circuit operates when a bank active signal of the corresponding bank is activated.

3. The semiconductor memory device as recited in claim 2, wherein the Y-address input enable signal is assigned for the corresponding bank and controls a Y-address to be input to the corresponding bank.

4. The semiconductor memory device as recited in claim 3, wherein the Y-address input enable signal controls a pulse signal for controlling a Yi transistor in providing an input to the corresponding bank.

5. The semiconductor memory device as recited in claim 2, wherein the signal input unit activates the Y-address input enable signal of the corresponding bank when the bank-specific read/write signal of the corresponding bank is activated, deactivates the Y-address input enable signal of the corresponding bank when the bank-specific read/write signals of the other banks are activated, and deactivates the Y-address input enable signal of the corresponding bank irrespective of the logical level of the bank-specific read/write signal of the corresponding bank when the bank active signal of the corresponding bank is deactivated.

6. The semiconductor memory device as recited in claim 3, further comprising:
   a command decoder configured to decode an external command to generate an internal read signal and an internal write signal; and
   a read/write signal generator configured to generate the bank-specific read/write signal activated in the read/write operation of the corresponding bank in response to the internal read signal, the internal write signal, and a bank address.

7. The semiconductor memory device as recited in claim 1, wherein the bank-specific read/write signal of the corresponding bank is a pulse signal.

8. A semiconductor memory device, comprising:
   address input path selection circuits configured to output Y-address input enable signals in response to bank-specific read/write signals; and
   a bank active signal generator configured to enable the address input path selection circuits in response to an internal active signal and a bank address,
   wherein the address input path selection circuits correspond to plural banks of the semiconductor memory device, respectively, and each include:
   a signal input unit configured to activate the Y-address input enable signal of a corresponding bank in response to a bank-specific read/write signal of the corresponding bank and to deactivate the Y-address input enable signal in response to bank-specific read/write signals of others of the banks and the bank specific read/write signal of the corresponding bank is activated when the corresponding bank is selected and deactivated when the corresponding bank is not selected.

9. The semiconductor memory device as recited in claim 8, wherein the address input path selection circuits each further include:
   a latch unit configured to latch the Y-address input enable signal.

10. The semiconductor memory device as recited in claim 8, wherein the Y-address input enable signal is assigned for the corresponding bank and controls a Y-address to be input to the corresponding bank.

11. The semiconductor memory device as recited in claim 10, wherein the Y-address input enable signal controls a pulse signal for controlling a Yi transistor in providing an input to the corresponding bank.

12. The semiconductor memory device as recited in claim 8, wherein the bank active signal generator activates bank active signals corresponding to the banks, respectively.

13. The semiconductor memory device as recited in claim 12, wherein the signal input unit deactivates the Y-address input enable signal of the corresponding bank irrespective of the logical level of the bank-specific read/write signals when the bank active signal of the corresponding bank is deactivated.

14. The semiconductor memory device as recited in claim 8, further comprising:
   a command decoder configured to decode an external command to generate an internal read/write signal and the internal active signal; and
   a read/write signal generator configured to generate the bank-specific read/write signal activated in the read/ write operation of the corresponding bank in response to the internal read signal, the internal write signal, and the bank address.

15. The semiconductor memory device as recited in claim 8, wherein the bank-specific read/write signals are pulse signals.

16. The semiconductor memory device of claim 1, wherein the bank specific read/write signal of the corresponding bank is activated in the read/write operation of the corresponding bank and deactivated when the read/write operation of the corresponding bank is not performed.

* * * * *